US012619142B2

(12) United States Patent　　　　(10) Patent No.:　US 12,619,142 B2
Sun et al.　　　　　　　　　　　　　(45) Date of Patent:　　　May 5, 2026

(54) METHODS OF MANUFACTURING PELLICLE FOR EUV LITHOGRAPHY MASKS

(71) Applicant: TAIWAN SEMICONDUCTOR MANUFACTURING COMPANY, LTD., Hsinchu (TW)

(72) Inventors: Ting-Pi Sun, Taichung City (TW); Pei-Cheng Hsu, Taipei (TW); Hsin-Chang Lee, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 551 days.

(21) Appl. No.: 18/116,684

(22) Filed: Mar. 2, 2023

(65) Prior Publication Data

US 2024/0069427 A1　　　Feb. 29, 2024

Related U.S. Application Data

(60) Provisional application No. 63/402,860, filed on Aug. 31, 2022.

(51) Int. Cl.
　　G03F 1/62　　　　　(2012.01)
　　G03F 1/22　　　　　(2012.01)
　　G03F 1/64　　　　　(2012.01)
(52) U.S. Cl.
　　CPC .................. G03F 1/22 (2013.01); G03F 1/62 (2013.01); G03F 1/64 (2013.01)

(58) Field of Classification Search
　　CPC ..................................... G03F 1/62; G03F 1/64
　　See application file for complete search history.

(56) References Cited

U.S. PATENT DOCUMENTS

| | | | |
|---|---|---|---|
| 5,419,972 A * | 5/1995 | Kawaguchi | G03F 1/64 |
| | | | 430/4 |
| 11,281,092 B2 | 3/2022 | Lee et al. | |
| 2009/0038681 A1* | 2/2009 | Trancik | H01G 9/2022 |
| | | | 977/750 |
| 2010/0305298 A1* | 12/2010 | Kim | H01B 1/24 |
| | | | 528/332 |
| 2018/0329289 A1* | 11/2018 | Gallagher | G03F 1/62 |
| 2023/0194977 A1 | 6/2023 | Ono et al. | |

FOREIGN PATENT DOCUMENTS

| | | | | | |
|---|---|---|---|---|---|
| CN | 104497229 A | * | 4/2015 | | |
| CN | 106807606 A | * | 6/2017 | .......... | B05D 3/0486 |
| CN | 109839392 A | * | 6/2019 | | |
| CN | 110272037 A | * | 9/2019 | ........ | B01D 67/0079 |
| CN | 110817846 A | * | 2/2020 | .......... | C01B 32/168 |
| CN | 113889348 A | * | 1/2022 | ........ | C08G 73/0266 |
| JP | 2002131890 A | * | 5/2002 | | |
| JP | 2005336043 A | * | 12/2005 | | |

(Continued)

*Primary Examiner* — Martin J Angebranndt
(74) *Attorney, Agent, or Firm* — STUDEBAKER BRACKETT PLLC

(57)　　　　　ABSTRACT

In a method of manufacturing a pellicle for an extreme ultraviolet (EUV) photomask, a nanotube layer including a plurality of carbon nanotubes is formed, the nanotube layer is attached to a pellicle frame, and a solvent dipping treatment is performed to the nanotube layer by applying bubbles in a solvent to the nanotube layer.

20 Claims, 18 Drawing Sheets

(56)             References Cited

FOREIGN PATENT DOCUMENTS

| | | | | |
|----|----------------|------|---------|-------------------|
| JP | 2012160434 | A | * 8/2012 | |
| JP | 2018008838 | A | * 1/2018 | |
| JP | 2020164354 | A | * 10/2020 | |
| KR | 20120091780 | A | * 8/2012 | .............. H01J 9/025 |
| KR | 20180103775 | A | * 9/2018 | ......... G03F 7/70983 |
| RU | 2750600 | C1 | * 6/2021 | ........... A62B 23/025 |
| TW | 202140378 | A | 11/2021 | |
| WO | WO-2011086354 | A2 | * 7/2011 | .............. B01F 33/40 |
| WO | WO-2018159638 | A1 | * 9/2018 | ........... C01B 32/158 |
| WO | 2022169170 | A2 | 8/2022 | |
| WO | WO-2023036568 | A1 | * 3/2023 | ......... G03F 7/70983 |

* cited by examiner

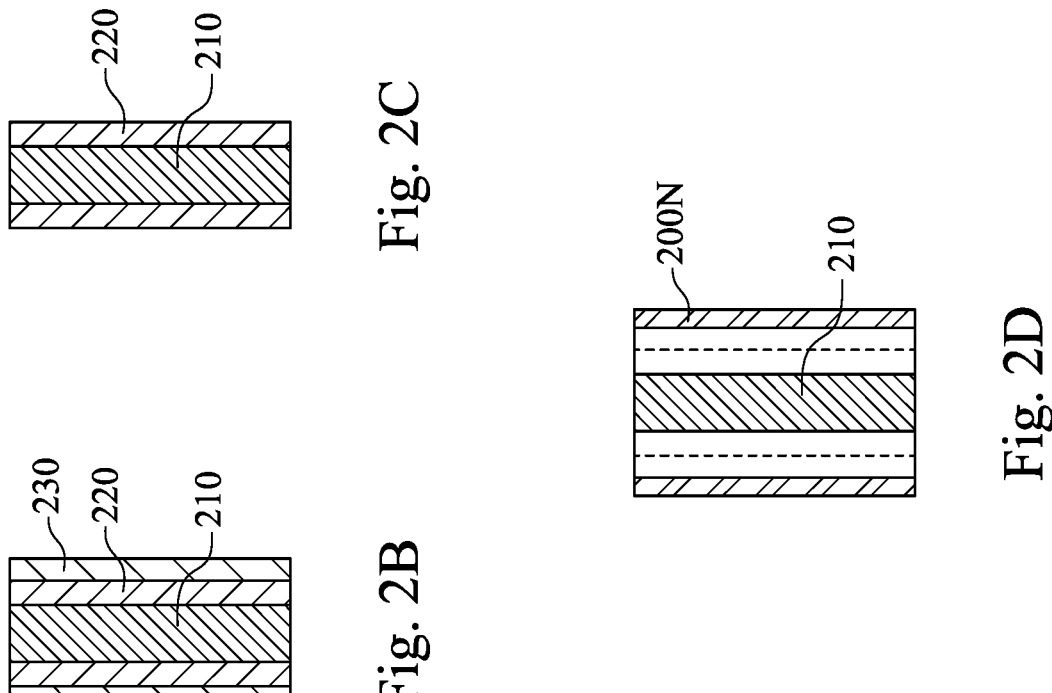
Fig. 2C
Fig. 2D
Fig. 2B
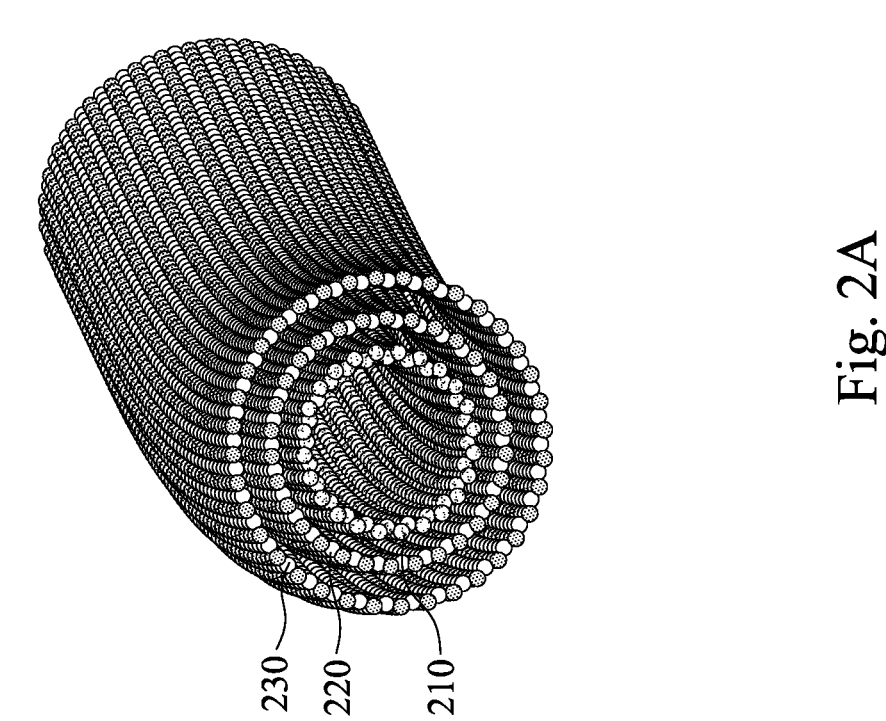
Fig. 2A

Nanotube formation

Put Nanotubes in solution

Deposit on membrane

Dry nanotubes on membrane

Nanotubes in solution

90

Membrane 80

CNTs solution

Filter membrane

Vacuum

Nanotube network pump

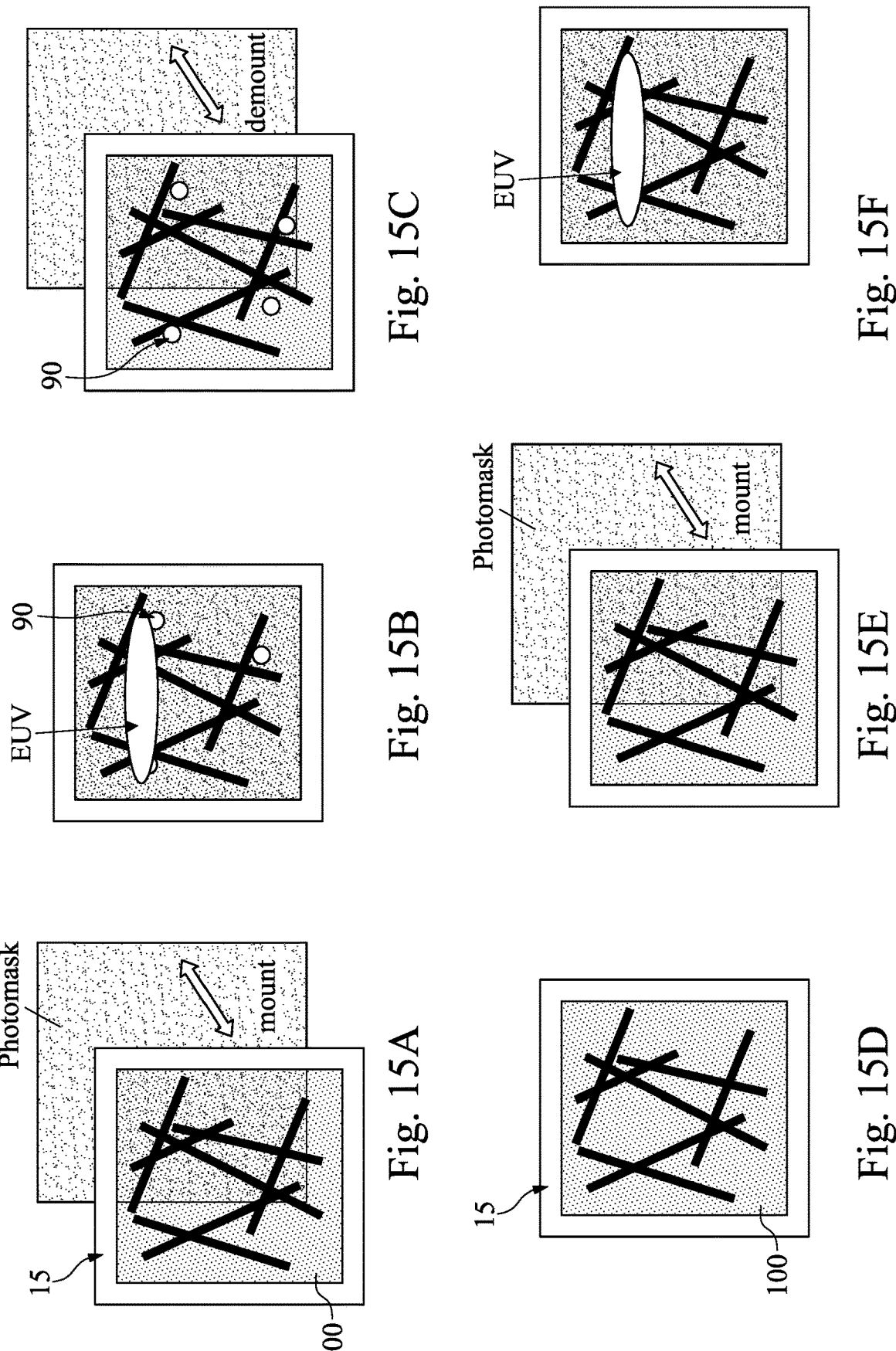

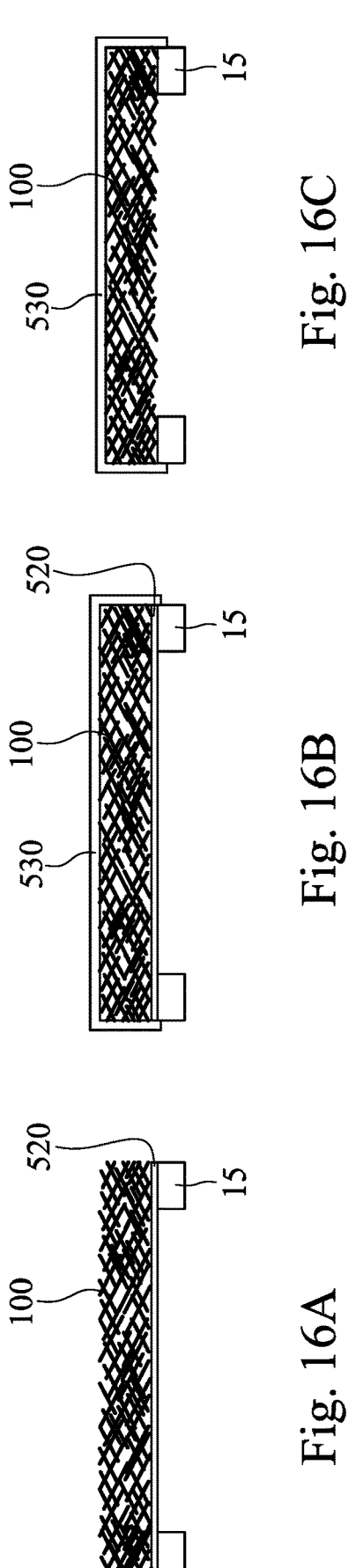
Fig. 16A
Fig. 16B
Fig. 16C
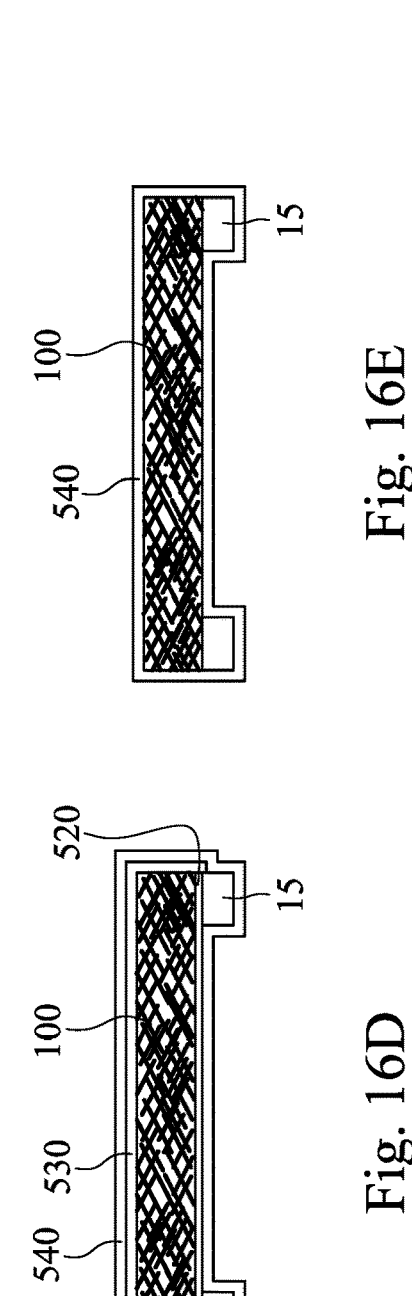
Fig. 16D
Fig. 16E

Figures 17A, 17B, 17C, 17D, 17E:
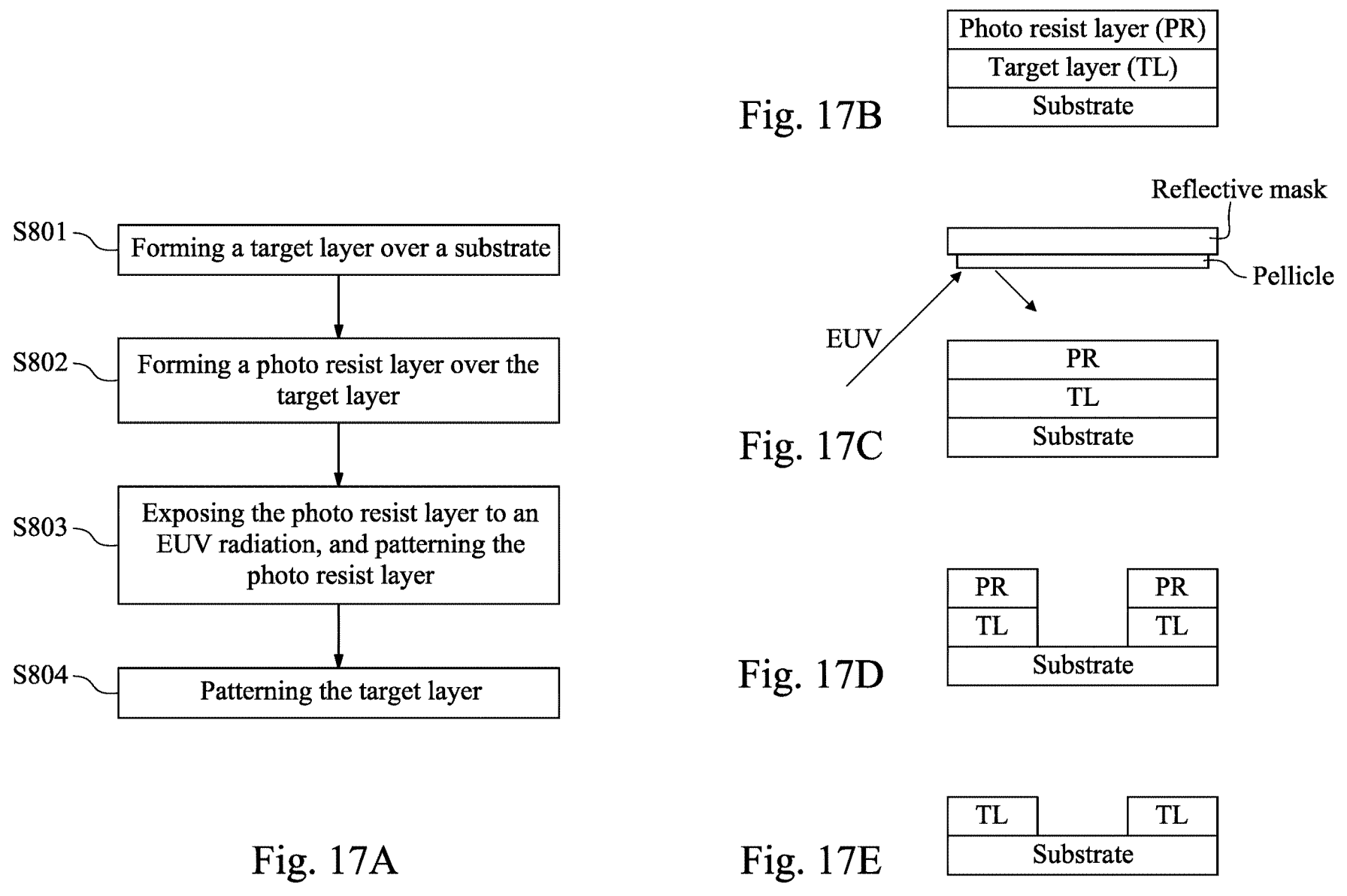

S801 Forming a target layer over a substrate

S802 Forming a photo resist layer over the target layer

S803 Exposing the photo resist layer to an EUV radiation, and patterning the photo resist layer S804 Patterning the target layer

METHODS OF MANUFACTURING PELLICLE FOR EUV LITHOGRAPHY MASKS

RELATED APPLICATIONS

This application claims priority of U.S. Provisional Patent Application No. 63/402,860 filed on Aug. 31, 2022, the entire contents of which are incorporated herein by reference.

BACKGROUND

A pellicle is a thin transparent film stretched over a frame that is glued over one side of a photo mask to protect the photo mask from damage, dust and/or moisture. In extreme ultraviolet (EUV) lithography, a pellicle having a high transparency in the EUV wavelength region, a high mechanical strength and a low or no contamination is generally required. An EUV transmitting membrane is also used in an EUV lithography apparatus instead of a pellicle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C and 2D show various views of multi-wall nanotubes in accordance with embodiments of the present disclosure.

FIGS. 15A, 15B, 15C, 15D, 15E and 15F show an EUV lithography process in accordance with embodiments of the present disclosure.

FIGS. 16A, 16B, 16C, 16D and 16E show diagrams of a pellicle in accordance with some embodiments of the present disclosure.

FIG. 17A shows a flowchart of a method making a semiconductor device, and FIGS. 17B, 17C, 17D and 17E show a sequential manufacturing operation of a method of making a semiconductor device in accordance with embodiments of present disclosure.

DETAILED DESCRIPTION

Figures 1A, 1B:
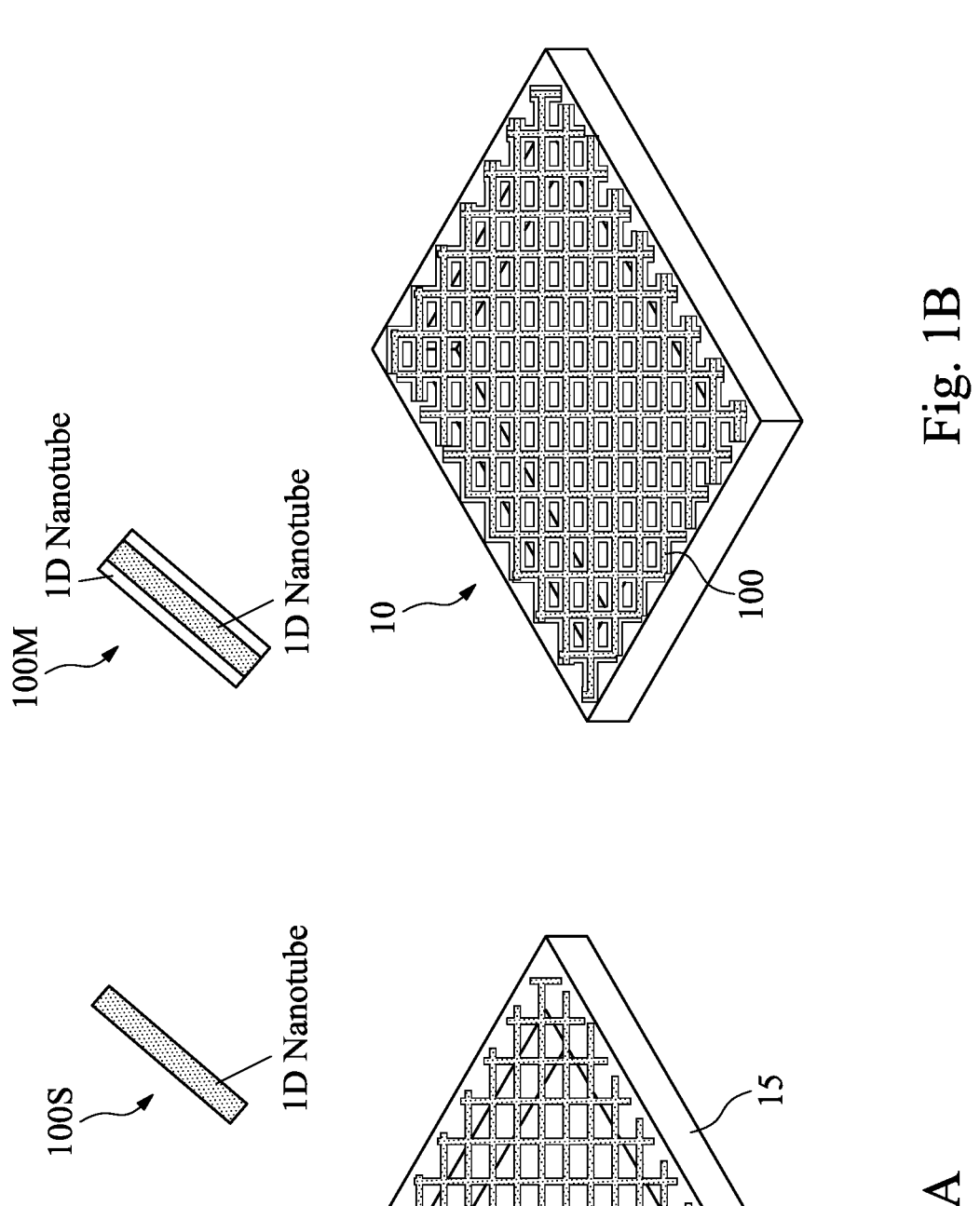
FIGS. 1A and 1B show pellicles for an EUV photo mask in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

EUV lithography is one of the crucial techniques for extending Moore's law. However, due to wavelength scaling from 193 nm (ArF) to 13.5 nm, the EUV light source suffers from strong power decay due to environmental adsorption. Even though a stepper/scanner chamber is operated under vacuum to prevent strong EUV adsorption by gas, maintaining a high EUV transmittance from the EUV light source to a wafer is still an important factor in EUV lithography.

A pellicle generally requires a high transparency and a low reflectivity. In UV or DUV lithography, the pellicle film is made of a transparent resin film. In EUV lithography, however, a resin based film would not be acceptable, and a non-organic material, such as a polysilicon, silicide or metal film, is used.

Carbon nanotubes (CNTs) are one of the materials suitable for a pellicle for an EUV reflective photo mask, because CNTs have a high EUV transmittance of more than 96.5%. Generally, a pellicle for an EUV reflective mask requires the following properties: (1) Long life time in a hydrogen radical rich operation environment in an EUV stepper/scanner; (2) Strong mechanical strength to minimize the sagging effect during vacuum pumping and venting operations; (3) A high or perfect blocking property for particles larger than about 20 nm (killer particles); and (4) A good heat dissipation to prevent the pellicle from being burnt out by EUV radiation. Other nanotubes made of a non-carbon based material are also usable for a pellicle for an EUV photo mask. In some embodiments of the present disclosure, a nanotube is a one dimensional elongated tube having a diameter in a range from about 0.5 nm to about 100 nm.

In the present disclosure, a pellicle for an EUV photo mask includes a network membrane having a plurality of nanotubes that form a mesh structure. Further, a method of treating the network membrane to increase mechanical strength is also disclosed.

FIGS. 1A and 1B show EUV pellicles 10 in accordance with an embodiment of the present disclosure. In some embodiments, a pellicle 10 for an EUV reflective mask includes a main network membrane 100 disposed over and attached to a pellicle frame 15. In some embodiments, as shown in FIG. 1A, the main network membrane 100 includes a plurality of single wall nanotubes 100S, and in other embodiments, as shown in FIG. 1B, the main network membrane 100 includes a plurality of multiwall nanotubes 100M. In some embodiments, the single wall nanotubes are carbon nanotubes. In some embodiments, some of the single wall nanotubes form a bundle of nanotubes by being closely attached to each other.

In some embodiments, a multiwall nanotube is a co-axial nanotube having two or more tubes co-axially surrounding an inner tube(s). In some embodiments, the main network membrane 100 includes only one type of nanotubes (single wall/multiwall, or material) and in other embodiments, different types of nanotubes form the main network membrane 100. In some embodiments, the multiwall nanotubes are multiwall carbon nanotubes. In some embodiments, some of the multiwall nanotubes form a bundle of nanotubes by being closely attached to each other.

In some embodiments, a pellicle (support) frame 15 is attached to the main network membrane 100 to maintain a space between the main network membrane of the pellicle and an EUV mask (pattern area) when mounted on the EUV mask. The pellicle frame 15 of the pellicle is attached to the surface of the EUV photo mask with an appropriate bonding material. In some embodiments, the bonding material is an adhesive, such as an acrylic or silicon based glue or an A-B cross link type glue. The size of the frame structure is larger than the area of the black borders of the EUV photo mask so that the pellicle covers not only the circuit pattern area of the photo mask but also the black borders.

FIGS. 2A, 2B, 2C and 2D show various views of multiwall nanotubes in accordance with embodiments of the present disclosure.

In some embodiments, the nanotubes in the main network membrane 100 include multiwall nanotubes, which are also referred to as co-axial nanotubes. FIG. 2A shows a perspective view of a multiwall co-axial nanotube having threes tubes 210, 220 and 230 and FIG. 2B shows a cross sectional view thereof. In some embodiments, the inner tube 210 and outer tubes 220 and 230 are carbon nanotubes. In other embodiments, one or more of the inner or two outer tubes are non-carbon based nanotubes, such as boron nitride nanotubes.

The number of tubes of the multiwall nanotubes is not limited to three. In some embodiments, the multiwall nanotube has two co-axial nanotubes as shown in FIG. 2C, and in other embodiments, the multiwall nanotube includes the innermost tube 210 and the first to N-th nanotubes including the outermost tube 200N, where N is a natural number from 1 to about 20, as shown in FIG. 2D. In some embodiments, N is up to 10 or up to 5. In some embodiments, at least one of the first to the N-th outer layers is a nanotube coaxially surrounding the innermost nanotube 210. In some embodiments, all the innermost tube 210 and the first to the N-th outer layers are carbon nanotubes. In other embodiments, one or more of the tubes are non-carbon based nanotubes.

In some embodiments, a diameter of the innermost nanotube is in a range from about 0.5 nm to about 20 nm and is in a range from about 1 nm to about 10 nm in other embodiments. In some embodiments, a diameter of the multiwall nanotubes (i.e., diameter of the outermost tube) is in a range from about 3 nm to about 40 nm and is in a range from about 5 nm to about 20 nm in other embodiments. In some embodiments, a length of the multiwall nanotube is in a range from about 0.5 μm to about 50 μm and is in a range from about 1.0 μm to about 20 μm in other embodiments.

Figures 3A, 3B, 3C:
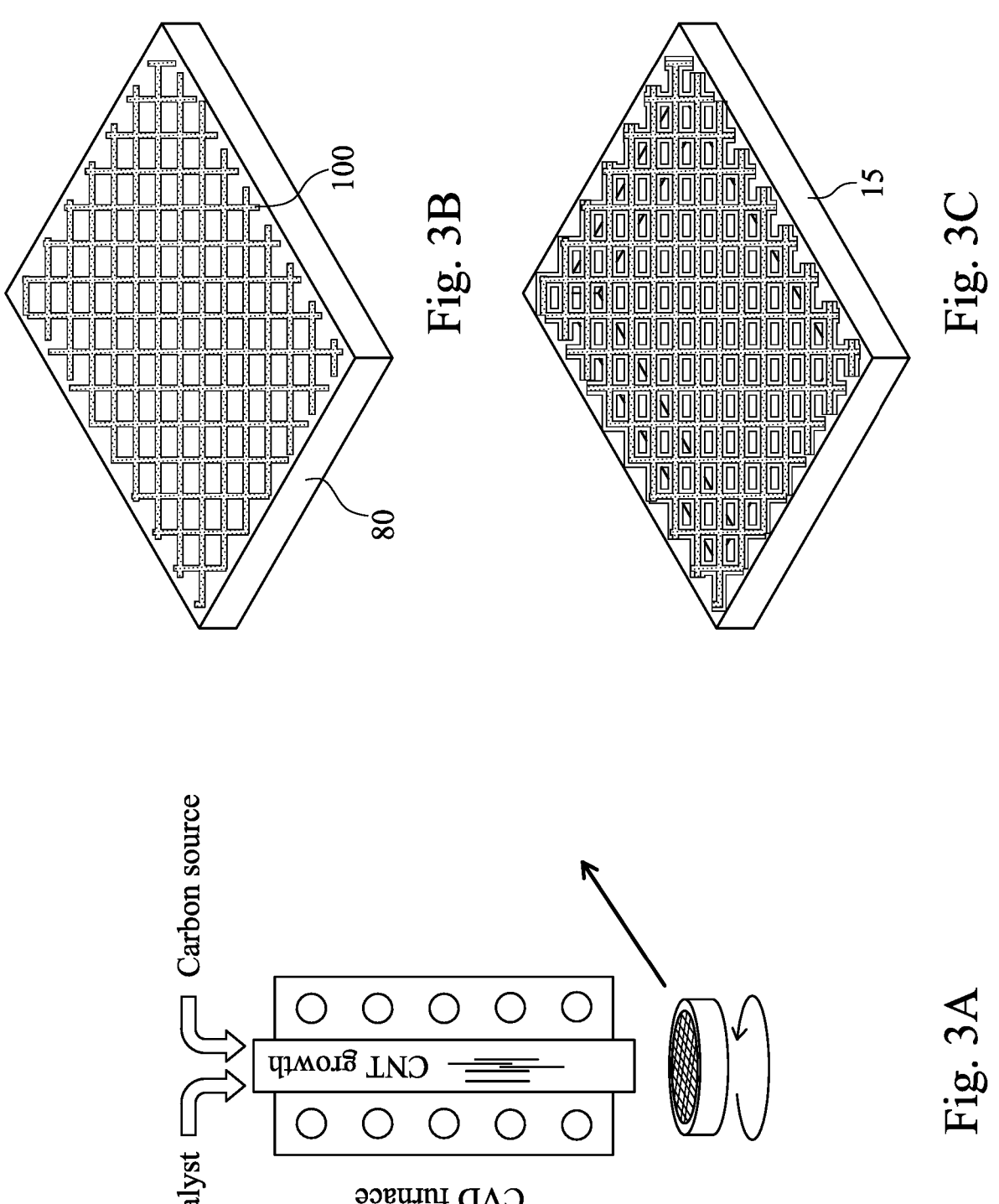
FIGS. 3A, 3B and 3C show a manufacturing process of a network membrane in accordance with an embodiment of the present disclosure.

FIGS. 3A, 3B and 3C show the manufacturing of nanotube network membranes for a pellicle in accordance with embodiments of the present disclosure.

In some embodiments, carbon nanotubes are formed by a chemical vapor deposition (CVD) process. In some embodiments, a CVD process is performed by using a vertical furnace as shown in FIG. 3A, and synthesized nanotubes are deposited on a support membrane 80 as shown in FIG. 3B. In some embodiments, carbon nanotubes are formed from a carbon source gas (precursor) using an appropriate catalyst, such as Fe or Ni. Then, the network membrane 100 formed over the support membrane 80 is detached from the support membrane 80, and transferred on to the pellicle frame 15 as shown in FIG. 3C. In some embodiments, a stage or a susceptor, on which the support membrane 80 is disposed, rotates continuously or intermittently (step-by-step manner) so that the synthesized nanotubes are deposited on the support membrane 80 with different or random directions.

Figures 3D, 3E:
FIG. 3D shows a manufacturing process of a network membrane.
FIG. 3E shows a flow chart thereof in accordance with an embodiment of the present disclosure.

FIG. 3D shows a manufacturing process of a network membrane and FIG. 3E shows a flow chart thereof in accordance with an embodiment of the present disclosure.

In some embodiments, carbon nanotubes are dispersed in a solution as shown in FIG. 3D. The solution includes a solvent, such as water or an organic solvent, and optionally a surfactant, such as sodium dodecyl sulfate (SDS). The nanotubes are one type or two or more types of nanotubes (material and/or wall numbers). In some embodiments, carbon nanotubes are formed by various methods, such as arc-discharge, laser ablation or chemical vapor deposition (CVD) methods.

As shown in FIG. 3D, a support membrane 80 is placed between a chamber or a cylinder in which the nanotube dispersed solution is disposed and a vacuum chamber. In some embodiments, the support membrane is an organic or inorganic porous or mesh material. In some embodiments, the support membrane is a woven or non-woven fabric. In some embodiments, the support membrane has a circular shape in which a pellicle size of a 150 mm×150 mm square (the size of an EUV mask) can be placed.

As shown in FIG. 3D, the pressure in the vacuum chamber is reduced so that a pressure is applied to the solvent in the chamber or cylinder. Since the mesh or pore size of the support membrane is sufficiently smaller than the size of the nanotubes, the nanotubes are captured by the support membrane while the solvent passes through the support membrane. The support membrane on which the nanotubes are deposited is detached from the filtration apparatus of FIG. 3D and then is dried. In some embodiments, the deposition by filtration is repeated so as to obtain a desired thickness of the nanotube network layer as shown in FIG. 3E. In some embodiments, after the deposition of the nanotubes in the solution, other nanotubes are dispersed in the same or new solution and the filter-deposition is repeated. In other embodiments, after the nanotubes are dried, another filter-deposition is performed. In the repetition, the same type of nanotubes is used in some embodiments, and different types of nanotubes are used in other embodiments. In some embodiments, the nanotubes dispersed in the solution include multiwall nanotubes.

FIGS. 4A and 4B to 6A and 6B show cross sectional views (the "A" figures) and plan (top) views (the "B" figures) of the various stages for manufacturing a pellicle for an EUV photo mask in accordance with an embodiment of the present disclosure. It is understood that additional operations can be provided before, during, and after the processes shown by FIGS. 4A-6B, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

Figures 4A, 4B, 5A, 5B:
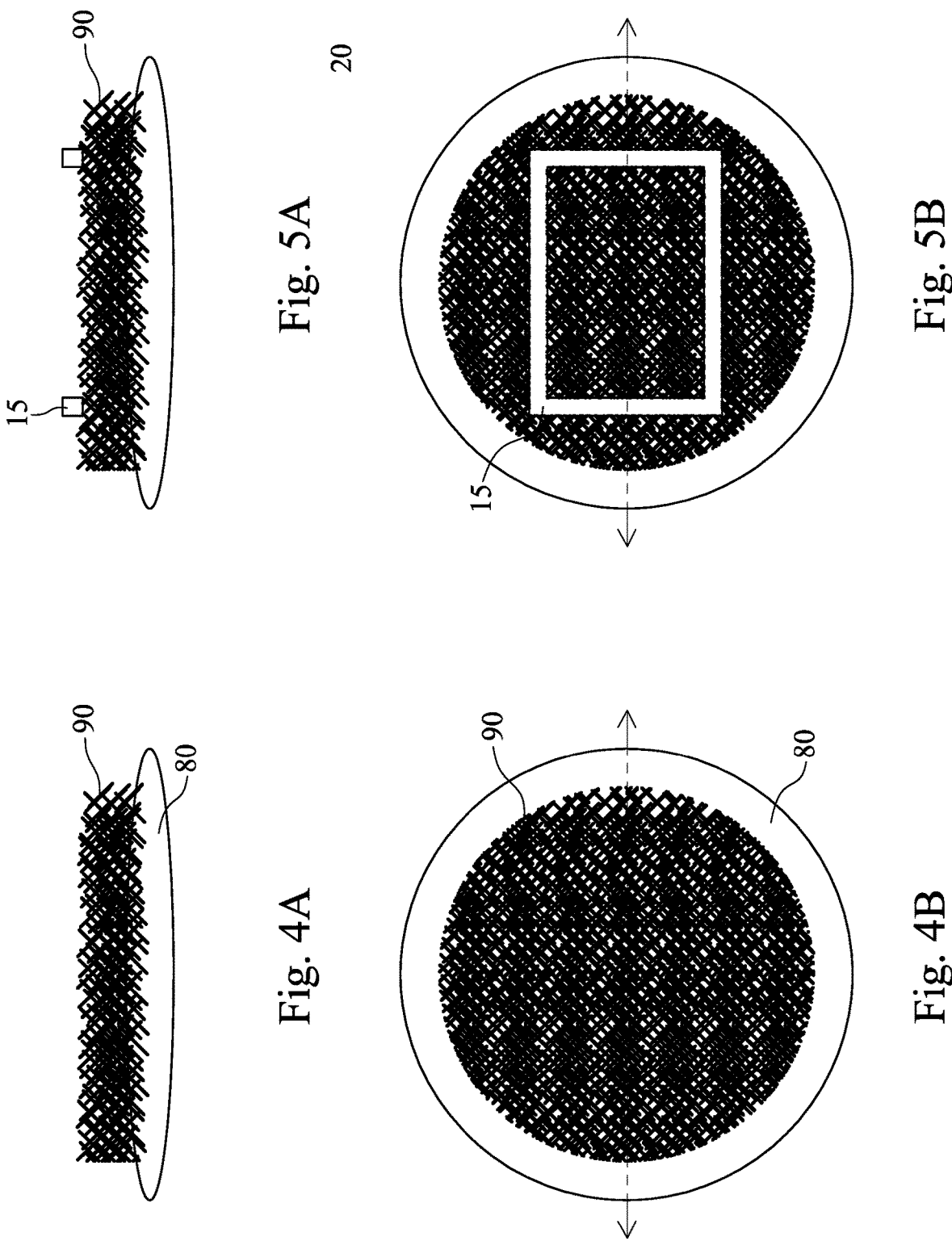
FIGS. 4A and 4B show a cross sectional view and a plan (top) view of one of the various stages for manufacturing a pellicle for an EUV photo mask in accordance with an embodiment of the present disclosure.
FIGS. 5A and 5B show a cross sectional view and a plan (top) view of one of the various stages for manufacturing a pellicle for an EUV photo mask in accordance with an embodiment of the present disclosure.

As shown in FIGS. 4A and 4B, a nanotube layer 90 is formed on a support membrane 80 by one or more method as explained above. In some embodiments, the nanotube layer 90 includes single wall nanotubes, multi wall nanotubes, or mixtures thereof. In some embodiments, the nanotube layer 90 includes single wall nanotubes only. In some embodiments, the nanotubes are carbon nanotubes.

Then, as shown in FIGS. 5A and 5B, a pellicle frame 15 is attached to the nanotube layer 90. In some embodiments, the pellicle frame 15 is formed of one or more layers of crystalline silicon, polysilicon, silicon oxide, silicon nitride, ceramic, metal or organic material. In some embodiments, as shown in FIG. 5B, the pellicle frame 15 has a rectangular (including square) frame shape, which is larger than the black border area of an EUV mask and smaller than the substrate of the EUV mask.

Figures 6A, 6B:
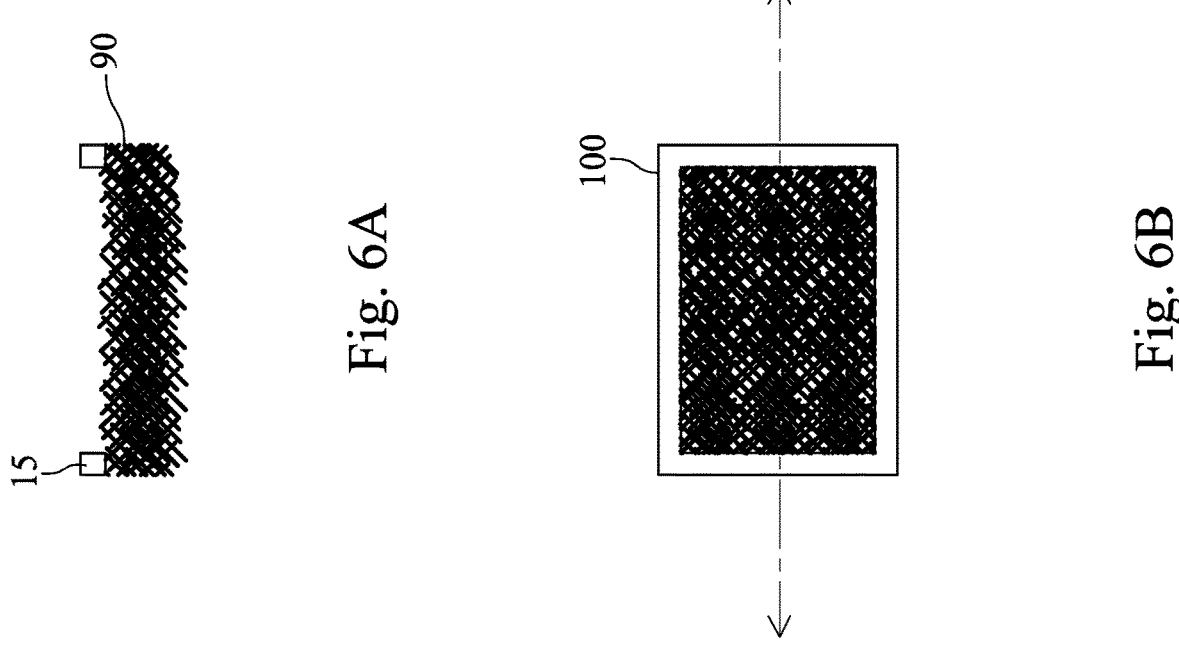
FIGS. 6A and 6B show a cross sectional view and a plan (top) view of one of the various stages for manufacturing a pellicle for an EUV photo mask in accordance with an embodiment of the present disclosure.

Next, as shown in FIGS. 6A and 6B, the nanotube layer 90 and the support membrane 80 are cut into a rectangular shape having the same size as or slightly larger than the pellicle frame 15, and then the support membrane 80 is detached or removed, in some embodiments. When the support membrane 80 is made of an organic material, the support membrane 80 is removed by wet etching using an organic solvent.

In some embodiments of the present disclosure, a pellicle membrane including a plurality of carbon nanotubes is subjected to a solvent dipping (wet) treatment to form a plurality of bundles of nanotubes in each of which the nanotubes are closely attached to each other.

Figure 7B:
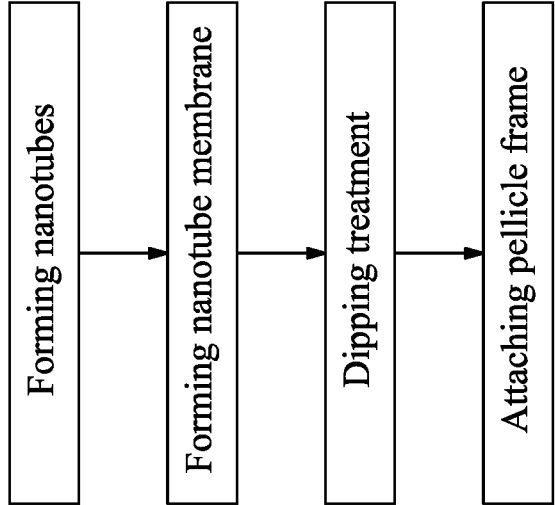
FIGS. 7A and 7B show a flow chart for manufacturing a pellicle for an EUV photo mask in accordance with embodiments of the present disclosure.
Figure 7A:
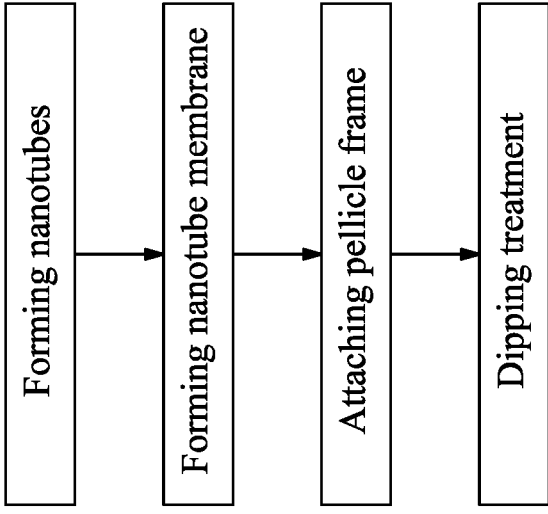

FIGS. 7A and 7B are flow charts showing a treatment process according to embodiments of the present disclosure. It is understood that additional operations can be provided before, during, and after the processes shown in FIGS. 7A and 7B, and some of the operations described below can be replaced or eliminated, for additional embodiments of the method. The order of the operations/processes may be interchangeable.

In the flow of FIG. 7A, as the processes described above, nanotubes are formed, and a membrane is formed by the nanotubes. Then, as set forth, a pellicle frame is attached to the membrane. Subsequently, a solvent dipping treatment is performed on the membrane. In the flow shown in FIG. 7B, before the pellicle frame is attached to the membrane, the membrane is subjected to the solvent dipping treatment.

In some embodiments, the solvent dipping treatment includes dipping the nanotube membrane into a solvent with micro or nano bubbles.

Figures 8A, 8B, 8C:
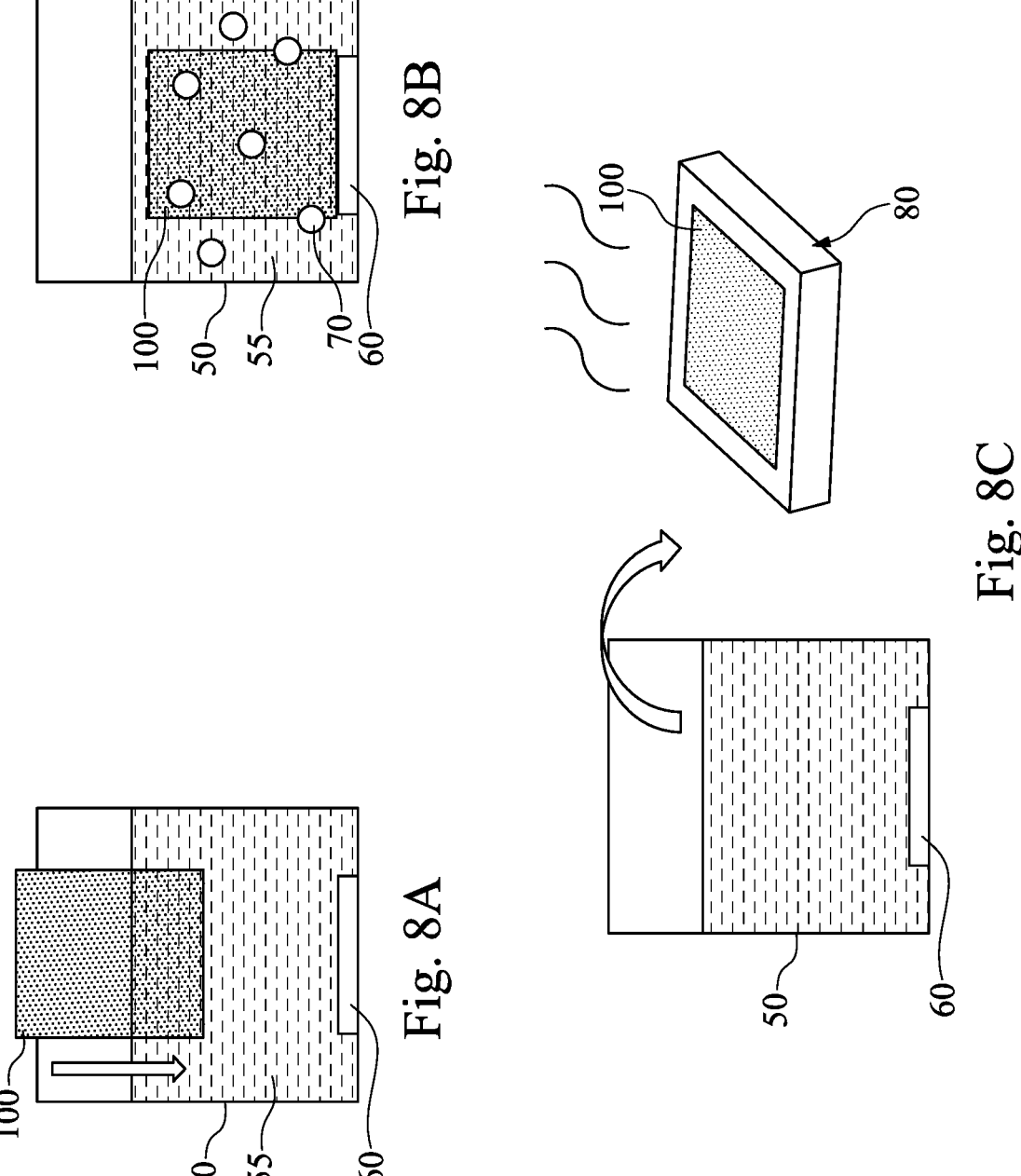
FIGS. 8A, 8B and 8C show various views of a sequential solvent dipping operation for a pellicle or a pellicle membrane in accordance with embodiments of the present disclosure.

FIGS. 8A, 8B and 8C show various views of a sequential operation of the solvent dipping treatment on the nanotube membrane 100 in accordance with an embodiment of the present disclosure. It is understood that additional operations can be provided before, during, and after the processes shown by FIGS. 8A-8C, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

In some embodiments, as shown in FIG. 8A, a nanotube membrane 100 with or without pellicle frame is dipped into a solvent 55 stored in a solvent tank 50. In some embodiments, the nanotube membrane 100 is vertically held and inserted into the solvent with a moving speed V1. In some embodiments, the moving speed V1 is in a range from about 1 mm per minute to about 1000 mm per minute. In other embodiments, the speed V1 is in a range from about 2 mm/min to about 200 mm/min. When the speed V1 is too high, the nanotube membrane may be damaged, and when the speed V1 is too low, the process time may be unnecessarily increased.

In some embodiments, the solvent 55 is water, an organic solvent or a mixture of water and at least one organic solvent. In some embodiments, an organic solvent is used because organic solvents generally have low surface tension, and therefore the organic solvent or the mixture of organic solvent and water can have a suitable surface tension to prevent the nanotube membrane from being damaged. In some embodiments, the organic solvent includes one or more of aliphatic hydrocarbons, aromatic hydrocarbons, amines, esters, ethers, ketones or alcohols. In some embodiments, the organic solvent includes one or more of methanol, ethanol, isopropanol, benzene, acetones, or toluene. Theses solvents have low surface tension and low boiling point and therefore evaporate easily. In some embodiments, the compound of the organic solvent contains a phenyl or hydroxyl group, and includes one or more of isopropanol (IPA) or benzyl alcohol. In some embodiments, the number of carbons in the solvent compound is 3-10.

In some embodiments, after the entire nanotube membrane 100 is dipped or immersed in the solvent 55, micro or nano bubbles 70 are generated from a bubble generator 60 into the solvent, as shown in FIG. 8B to form nanotube bundles. In some embodiments, the bubble generator 60 includes an ultrasonic bubble generator, which is configured to apply ultrasound of about 20 kHz to about 1 MHz to the solvent 55. In other embodiments, the bubble generator 60 includes a laser pulse generator that generate bubbles in the solvent. In some embodiments, the duration of one laser pulse is in a range from about 1 ns to about 100 ns with a duty ratio of about 0.5 to about 2.0, and the laser power is in a range from about 1 mJ to about 100 mJ. In some embodiments, the size (e.g., diameter) of the bubbles is in a range from about 1 nm to about 10 μm. In some embodiments, the size of nano bubbles is in a range from about 1 nm to about 500 nm, and the size of micro bubbles is in a range from about 1 μm to about 10 μm.

The treatment with the solvent 55 having the bubbles 70 is performed for about 1 min to about 2 hours in some embodiments. In other embodiments, the treatment is performed from about 5 min to about 60 min. If the time duration is too short, a sufficient numbers of the bundles of nanotubes may not be obtained, and if the time duration is too long, the process efficiency may be decreased and/or the membrane may be damaged.

After the predetermined treatment time has passed, the nanotube membrane 100 is removed from the solvent 55 and is dried with heat using a heating or drying apparatus (see FIGS. 12A or 12B) as shown in FIG. 8C. The speed V2 of removing the nanotube membrane from the solvent is in a range from about 1 mm per minute to about 1000 mm per minute. In other embodiments, the speed V2 is in a range from about 2 mm/min to about 200 mm/min. When the speed V2 is too high, the nanotube membrane may be damaged, and when the speed V2 is too low, the process time may be unnecessary increased.

Figure 9:
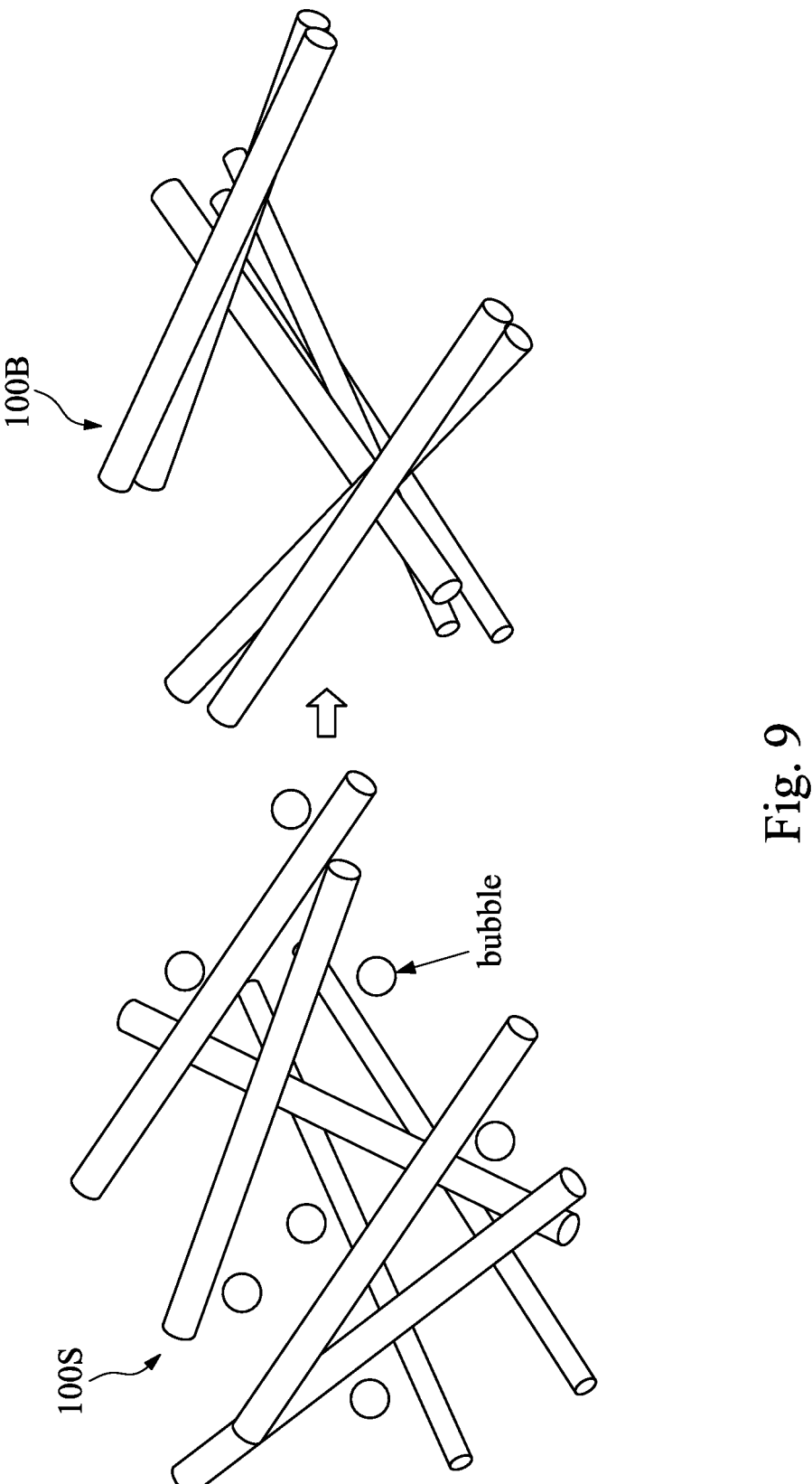
FIGS. 9 and 10 show schematic views illustrating formation of a bundle of nanotubes according to an embodiment of the present disclosure.
Figure 10:
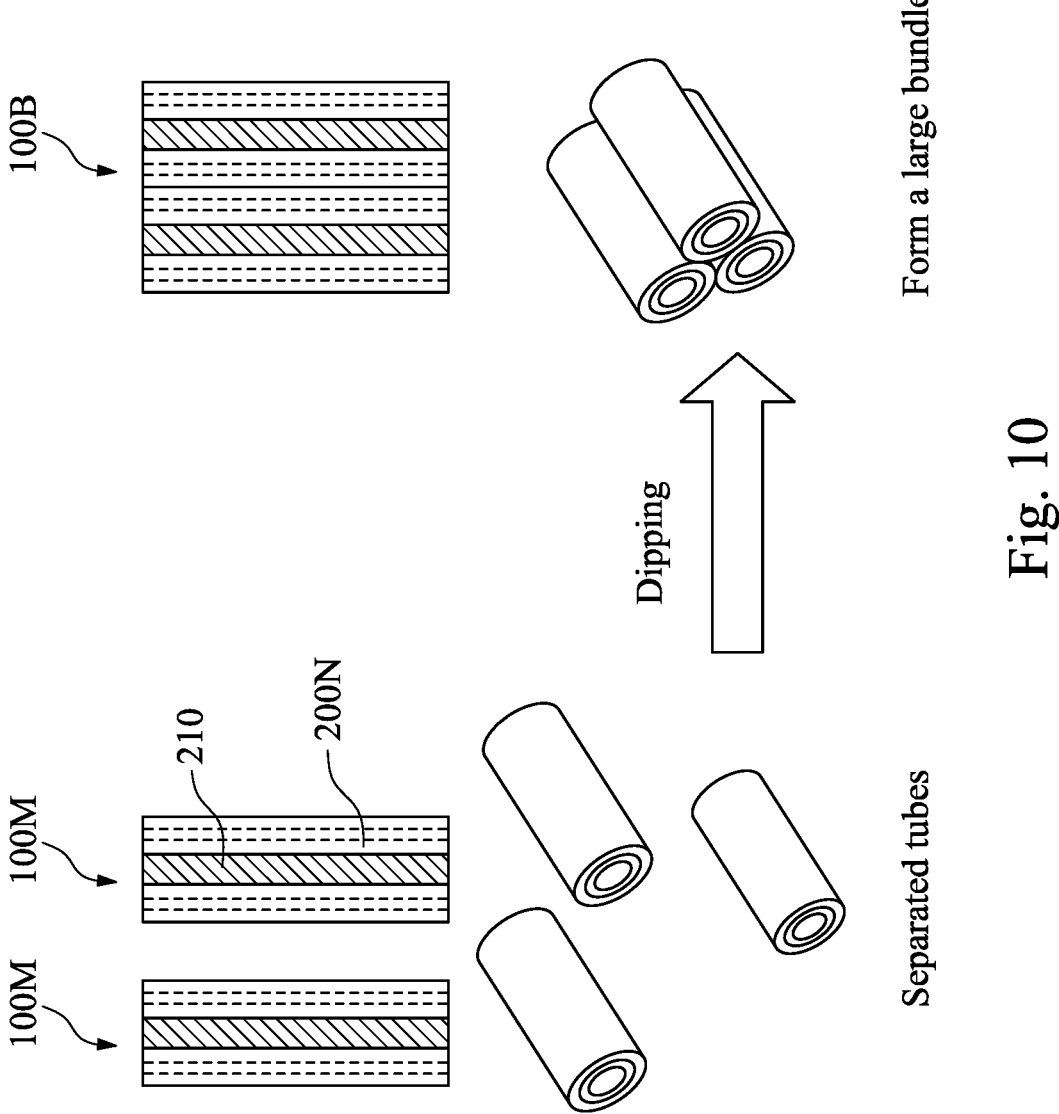

FIGS. 9 and 10 show the effects of the bubbled solvent dipping according to the present embodiments. In some embodiments, as shown in FIGS. 9 and 10, the solvent dipping treatment causes single separated nanotubes (single nanotubes 100S or multi wall nanotubes 100M) to join and form a bundle of nanotubes 100B having a seamless graphitic structure, in which the nanotubes are firmly bonded or joined more strongly than merely contacting each other. In some embodiments, the small bundles or singles tubes of nanotubes are pushed together by the bubbles, and then single or thin bundles of nanotubes form thick or large bundles of nanotubes. In some embodiments, three or more nanotubes are connected (bonded or joined) to form a bundle of nanotubes. The number of nanotubes in one bundle is 3 or more and up to 30, in some embodiments.

In some embodiments, the carbon nanotube membrane 100 as formed before the solvent dipping treatment includes no or a small number of bundles of nanotubes, and after the solvent dipping treatment, the number of the bundles of carbon nanotubes increases. In some embodiments, the peak diameter in the diameter distribution of the nanotubes in the membrane 100 before the solvent dipping treatment is in a range from about 3 nm to about 10 nm (less than 10 nm), and the peak diameter in the diameter distribution of the nanotubes in the membrane 100 after the solvent dipping treatment is in a range from about 10 nm (10 nm or more) to about 50 nm. In some embodiments, the average number of nanotubes in one bundle of nanotubes before the solvent dipping treatment is about 1 to about 3 (less than 3), and the average number of nanotubes in one bundle of nanotubes after the solvent dipping treatment is about 3 (3 or more) to about 30. If these numbers exceed the upper limit of the ranges, there may be large holes or openings (through holes) in the membrane, and thus, the ability of the pellicle to prevent contamination may be degraded.

Further, in some embodiments, a residual catalyst or catalyst particles in the nanotube membrane, and/or other contaminations can be removed by the solvent dipping operation.

Figures 11A, 11B, 11C:
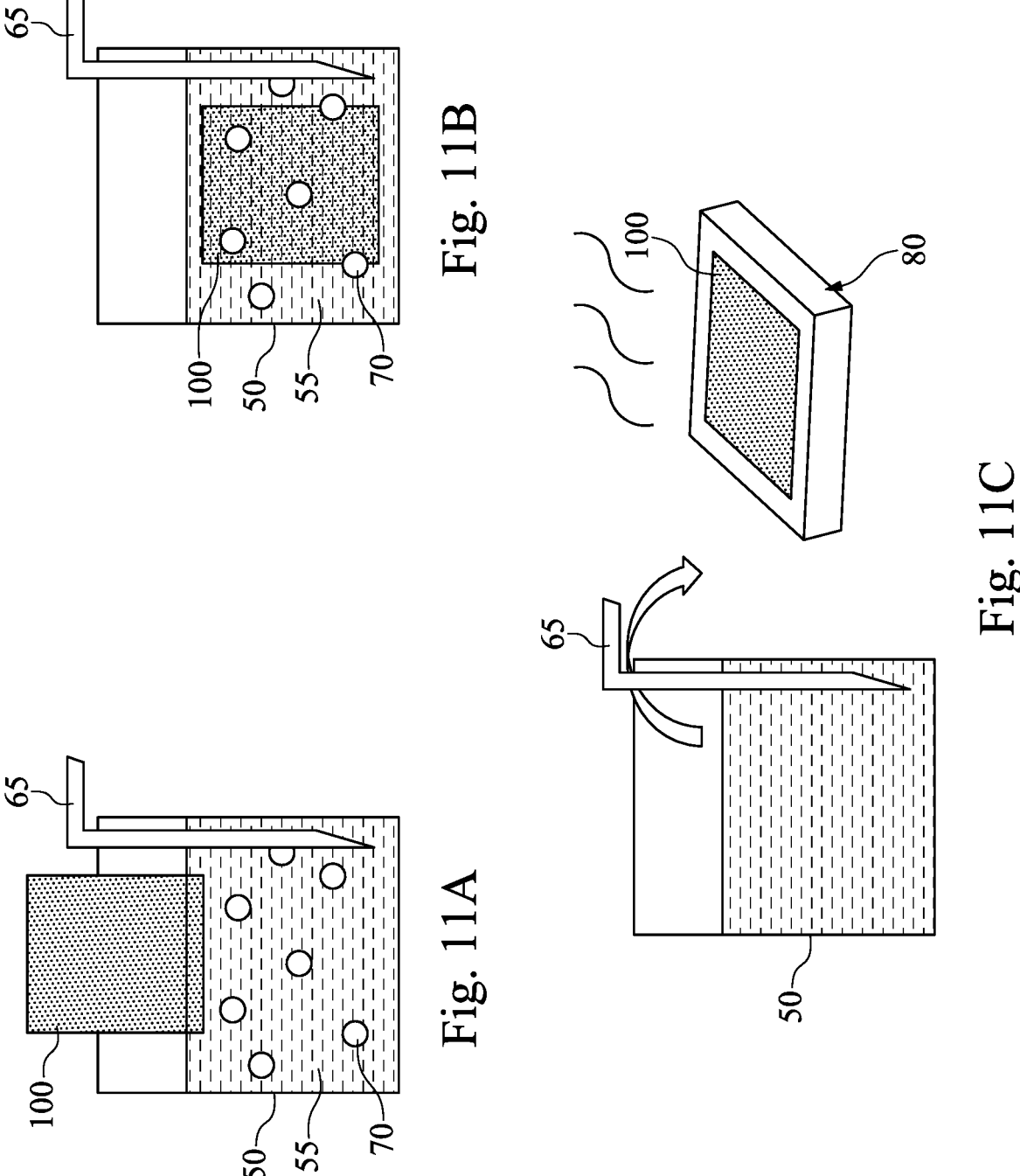
FIGS. 11A, 11B, 11C and 11D show various views of a sequential solvent dipping operation for a pellicle or a pellicle membrane in accordance with embodiments of the present disclosure.

FIGS. 11A, 11B and 11C show various views of a sequential operation of the solvent dipping treatment on the nanotube membrane 100 in accordance with an embodiment of the present disclosure. It is understood that additional operations can be provided before, during, and after the processes shown by FIGS. 11A-11C, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

In some embodiments, the micro or nano bubbles 70 are generated in the solvent 55 stored in the tank 50 before the nanotube membrane is dipped or inserted as shown in FIG. 11A. Then, similar to the operations as explained with respect to FIGS. 8A-8C, the nanotube membrane 100 is dipped or inserted into the solvent 55 as shown in FIG. 11B, and after the predetermined time passes, the nanotube membrane 100 is removed from the solvent and dried as shown in FIG. 11C. In some embodiments, the bubbles 70 are generated by the bubble generator 60 as shown in FIGS. 8A-8C. In other embodiments, as shown in FIGS. 11A-11D, a gas or a mixture of a gas and liquid are introduced from an inlet 65 into the solvent to generate the bubbles 70. In some embodiments, one or more gases, such as air, $N_2$, or Ar, is injected into the solvent 55 by a nano-scaled nozzle to break the gas into small bubbles. In some embodiments, the gas is pressurized to about $2 \times 10^5$ Pa to about $1 \times 10^6$ Pa. In other embodiments, the pressure is about 1 Pa to about $1 \times 10^6$ Pa. In some embodiments, a compressed mixture of gas (air, $N_2$, and/or Ar) and a liquid (e.g., water and/or organic solvent) is injected into the solvent 50 by a nano-scale nozzle. The diameter of the openings in the nano-scale nozzle is in a range from about 10 nm to about 1 μm in some embodiments. The gas or mixture injection can be applied to the embodiment of FIGS. 8A-8C. Other types of micro or nano bubble generators may be used.

Figure 11D:
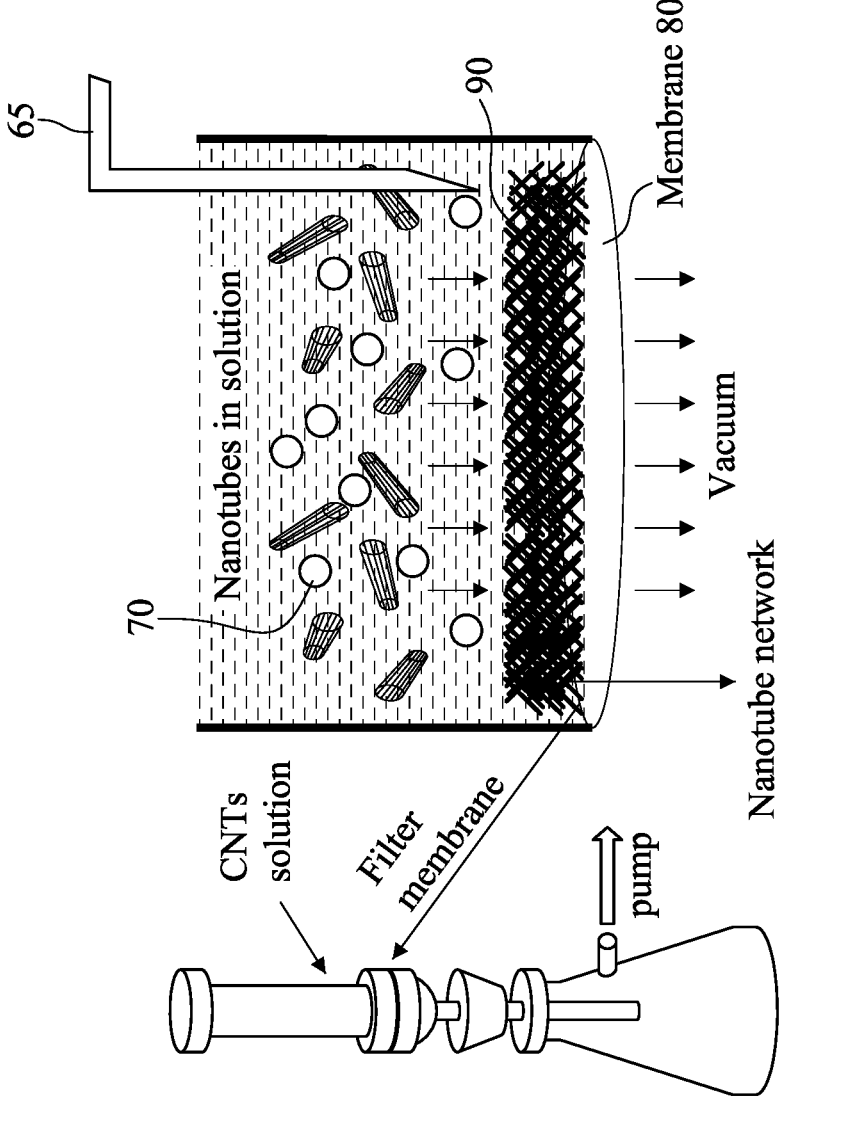

In some embodiments, as shown in FIG. 11D, during the formation of the nanotube membrane as explained with respect to FIG. 3D, bubbles 70 are generated by one of the methods mentioned above, and the number of the bundles of nanotubes is increased in the solvent, and then the nanotubes including the bundles of nanotubes are deposited on the support membrane 80.

Figures 12A, 12B:
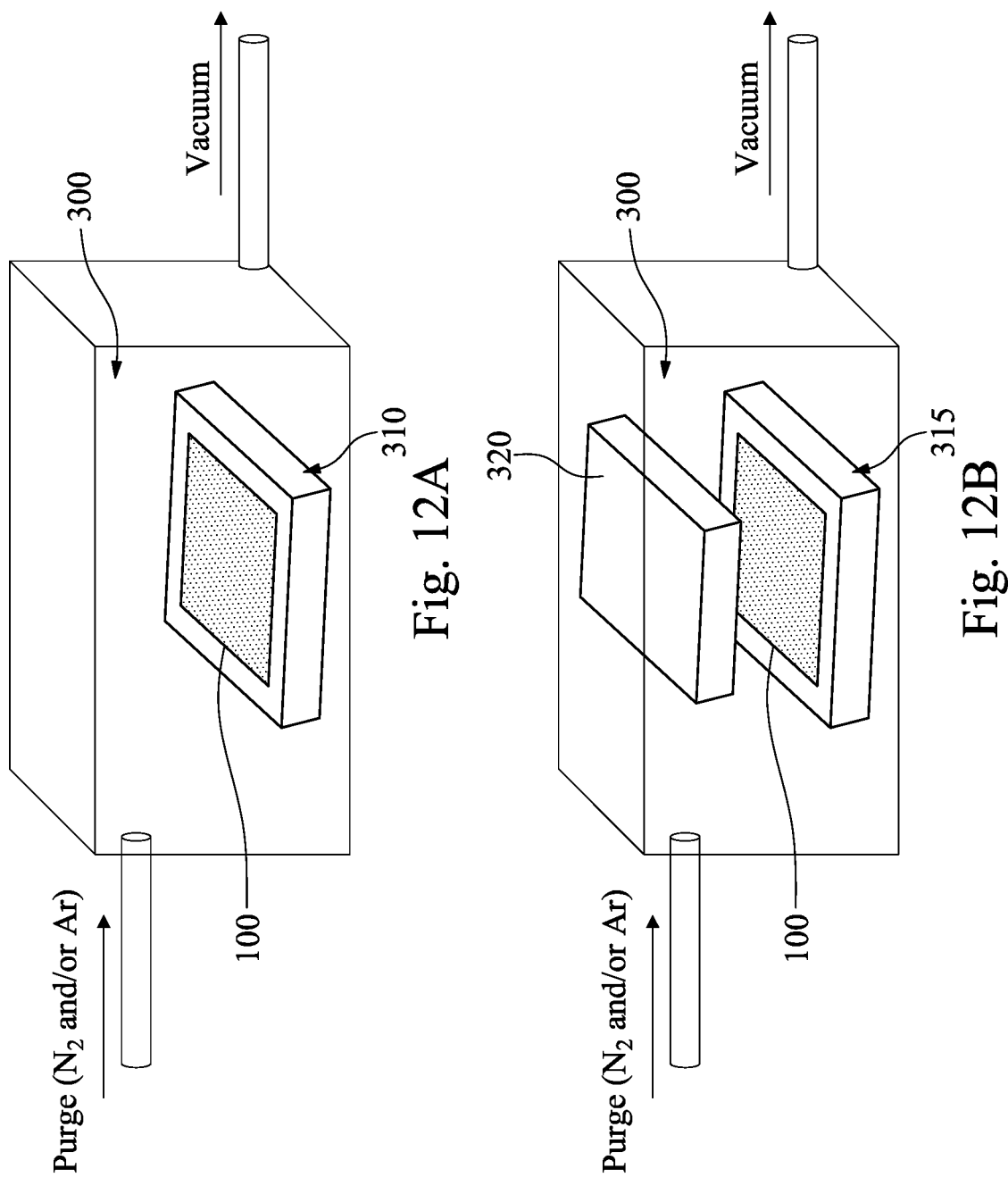
FIGS. 12A and 12B show schematic views illustrating a heating or drying apparatus in the solvent dipping operation according to embodiments of the present disclosure.

FIG. 12A shows a schematic view of a heating or drying apparatus according to the present disclosure. In some embodiments, the drying apparatus includes a chamber 300, in which a hot plate 310 is placed. The nanotube membrane 100 removed from the solvent 50 is placed on the hot plate 310. In some embodiments, the chamber 300 is configured to be evacuated by one or more vacuum pumps. In some embodiments, one or more gas inlets are provided to the chamber to supply one or more gases, such as air, $N_2$ and/or Ar.

FIG. 12B shows a schematic view of a heating or drying apparatus according to the present disclosure. In some embodiments, an infrared (IR) lamp 320 is used to heat the membrane 100 placed on a susceptor 315. In some embodiments, the susceptor 315 is a hot plate.

In some embodiments, the drying operation of the nanotube membrane 100 is performed at a temperature in a range from about 30° C. to about 300° C. under an air (containing oxygen) ambient to prevent oxidization of the nanotubes. In some embodiments, the drying operation of the nanotube membrane 100 is performed at a temperature in a range from about 300° C. (or 500° C.) to about 1000° C. under an inert gas (N$_2$ and/or Ar, no oxygen). In some embodiments, the drying time is in a range from about 10 min to 2 hours.

FIGS. 13A-13E shows schematic views illustrating catalyst removal and bundle formation by the solvent dipping treatment according to embodiments of the present disclosure.

Figures 13A, 13B, 13C, 13D, 13E:
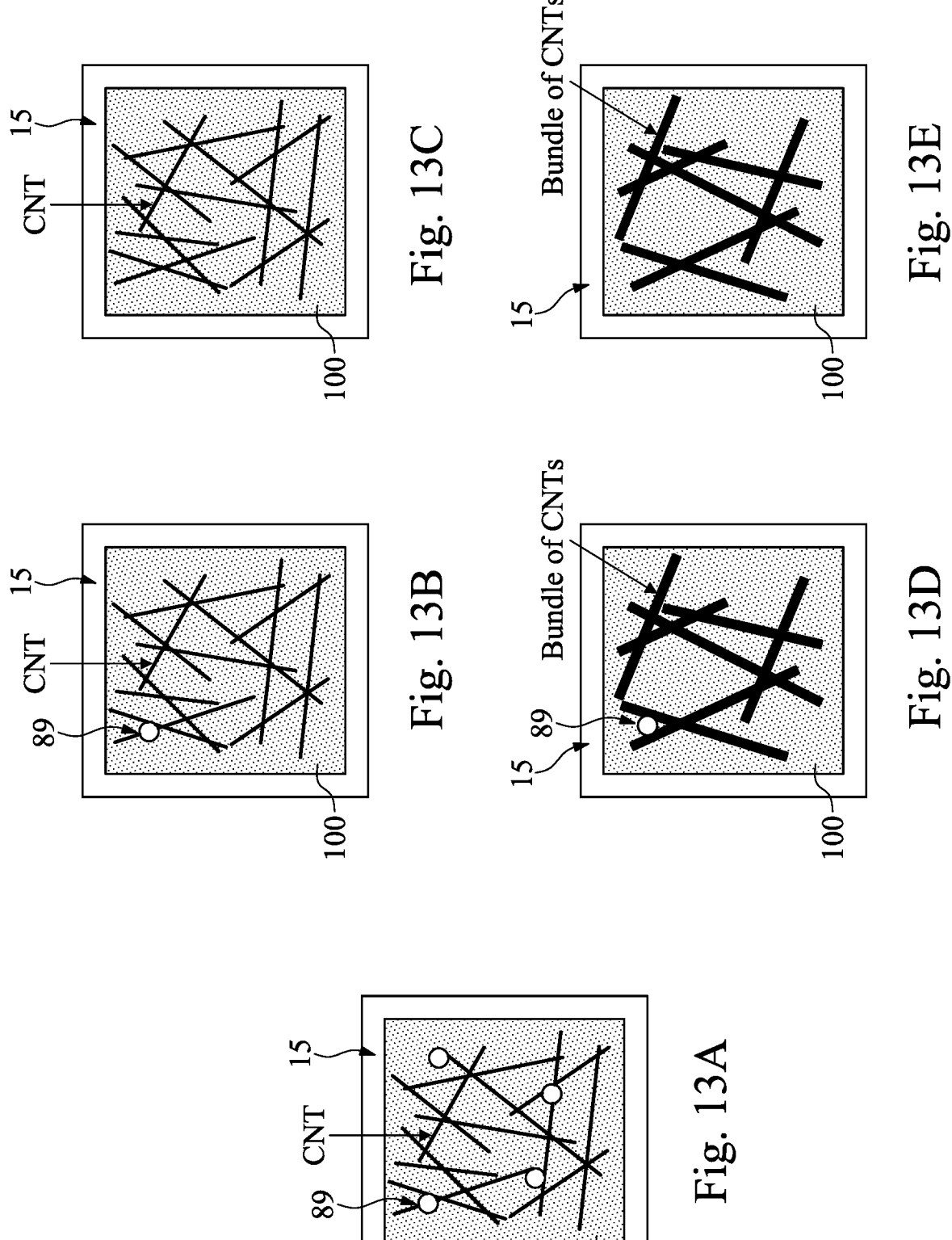
FIGS. 13A, 13B, 13C, 13D and 13E show various views of removal of residual catalysts and formation of a bundle of nanotubes in accordance with embodiments of the present disclosure

As set forth above, a carbon nanotube membrane 100 (with or without a pellicle frame 15) may include residual catalyst or catalyst particles 89 therein as shown in FIG. 13A. The solvent dipping treatment can remove a part of (see FIG. 13B) or all of (see FIG. 13C) the residual catalysts from the membrane 100. In addition, separate nanotubes as shown in FIG. 13A can be converted by the solvent dipping treatment to bundles of nanotubes as shown in FIGS. 13D and 13E. In some embodiments, an amount of the residual catalysts in the membrane as formed before the solvent dipping is in a range from about 7 wt % to about 15 wt %, and an amount of the residual catalysts in the membrane after the solvent dipping is less than about 2 wt %. In some embodiments, the amount of the residual catalysts in the membrane after the solvent dipping is in a range from about 0.1 wt % to about 1.5 wt %.

As set forth above, the solvent dipping treatment can improve chemical and mechanical properties of a network membrane formed by carbon nanotubes.

Figure 14:
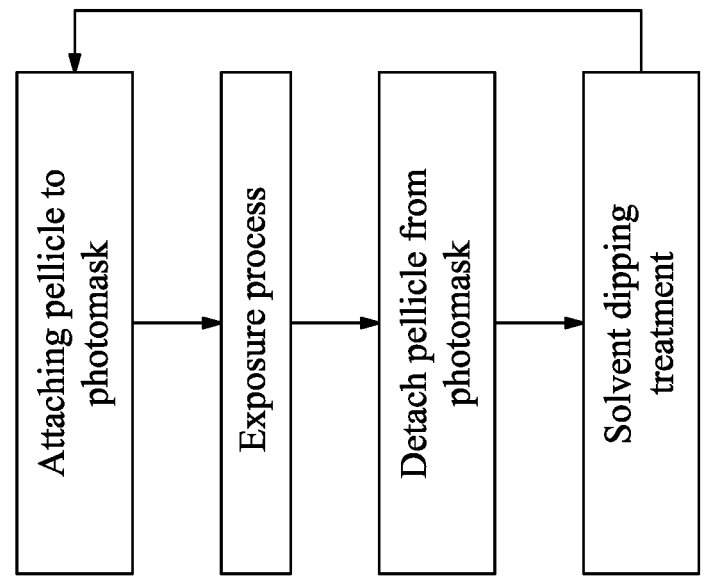
FIG. 14 is a flow chart for treating a pellicle for an EUV photo mask in accordance with embodiments of the present disclosure.

FIG. 14 shows a flow chart for treating a pellicle for an EUV photo mask and FIGS. 15A-15E show schematic views of treating the pellicle in accordance with embodiments of the present disclosure. It is understood that additional operations can be provided before, during, and after the processes shown in FIGS. 14 and 15A-15E, and some of the operations described below can be replaced or eliminated, for additional embodiments of the method. The order of the operations/processes may be interchangeable.

In some embodiments, the solvent dipping treatment is performed after the pellicle is used in EUV lithography operations, and then the treated pellicles are used in subsequent EUV lithography operations.

As shown in FIG. 14 and FIG. 15A, a pellicle with a frame that has been subjected to the solvent dipping treatment as set forth above is attached to an EUV photomask. Then, the photomask is used in EUV lithography operations subjected to EUV radiation. During the EUV lithography operation, contaminants or particles 90 may fall on the pellicle as shown in FIG. 15B. In some embodiments, the contaminant or particles include particles of Mo, SiC, TiN, Ta, Fe, Ni and others. After a predetermined number of EUV exposure operations are performed, the pellicle is demounted from the photomask as shown in FIG. 15C, and the pellicle is subjected to the solvent dipping treatment as described above to remove the contaminants and particles, as shown in FIG. 15D. In some embodiments, one or more defects caused by EUV radiation in the carbon nanotube membrane are removed or reduced by the bubbles during the solvent dipping treatment. In some embodiments, an additional wet or dry cleaning is performed before or after the solvent dipping treatment. Then, the pellicle is mounted again to an EUV photo mask as shown in FIG. 15E, and the photomask is subsequently used in EUV lithography operations as shown in FIG. 15F.

In some embodiments, the pellicle of the present embodiments further includes one or more cover layers. The cover layer(s) is attached to the membrane after the solvent dipping treatment is performed.

In some embodiments, a first cover sheet (or layer) 520 is formed at the bottom surface of the network membrane 100 between the frame 15 and the network membrane 100 as shown in FIG. 16A. In some embodiments, a second cover sheet 530 is formed over the network membrane 100 to seal the network membrane together with the first cover sheet 520, as shown in FIG. 16B. In some embodiments, no first cover sheet is used and only the second cover sheet 530 is used as show in FIG. 16C. In some embodiments, a third cover sheet 540 covers the entire structure of FIG. 16B (or FIG. 16A or 16C), as shown in FIG. 16D. In some embodiment, no first cover sheet and/or second cover sheet are used as shown in FIG. 16E. In some embodiments, the material of the third cover sheet 540 of FIG. 16E is the same as the material of the first and/or second cover sheets.

In some embodiments, one of or both of the first cover layer 520 and the second cover layer 530 include a two-dimensional material in which one or more two-dimensional layers are stacked. Here, a "two-dimensional" layer refers to one or a few crystalline layers of an atomic matrix or a network having thickness within the range of about 0.1-5 nm, in some embodiments. In some embodiments, the two-dimensional materials of the first cover layer 520 and the second cover layer 530 are the same or different from each other. In some embodiments, the first cover layer 520 includes a first two-dimensional material and the second cover layer 530 includes a second two-dimensional material.

In some embodiments, the two-dimensional material for the first cover layer 520 and/or the second cover layer 530 includes at least one of boron nitride (BN), graphene, and/or transition metal dichalcogenides (TMDs), represented by $MX_2$, where M=Mo, W, Pd, Pt, and/or Hf, and X=S, Se and/or Te. In some embodiments, a TMD is one of $MoS_2$, $MoSe_2$, $WS_2$ or $WSe_2$.

In some embodiments, a total thickness of each of the first cover layer 520 and the second cover layer 530 is in a range from about 0.3 nm to about 3 nm and is in a range from about 0.5 nm to about 1.5 nm in other embodiments. In some embodiments, a number of the two-dimensional layers of each of the two-dimensional materials of the first and/or second cover layers is 1 to about 20, and is 2 to about 10 in other embodiments. When the thickness and/or the number of layers is greater than these ranges, EUV transmittance of the pellicle may be decreased and when the thickness and/or the number of layers is smaller than these ranges, mechanical strength of the pellicle may be insufficient.

In some embodiments, a third cover layer 540 includes at least one layer of an oxide, such as $HfO_2$, $Al_2O_3$, $ZrO_2$, $Y_2O_3$, or $La_2O_3$. In some embodiments, the third cover layer 540 includes at least one layer of non-oxide compounds, such as $B_4C$, YN, $Si_3N_4$, BN, NbN, RuNb, $YF_3$, TiN, or ZrN. In some embodiments, the third cover layer 540 includes at least one metal layer made of, for example, Ru, Nb, Y, Sc, Ni, Mo, W, Pt, or Bi. In some embodiments, the third cover layer 540 is a single layer, and in other embodiments, two or more layers of these materials are used as the third cover layer 540. In some embodiments, a thickness of the third cover layer is in a range from about 0.1 nm to about 5 nm, and is in a range from about 0.2 nm to about 2.0 nm in other embodiments. When the thickness of the third cover layer 540 is greater than these ranges, EUV transmittance of the pellicle may be decreased and when the thickness of the third cover layer 540 is smaller than these ranges, the mechanical strength of the pellicle may be insufficient.

In some embodiments, the thickness of the network membrane 100 is in a range from about 5 nm to about 100 nm, and is in a range from about 10 nm to about 50 nm in other embodiments. When the thickness of the network membrane 100 is greater than these ranges, EUV transmittance may be decreased and when the thickness of the network membrane 100 is smaller than these ranges, the mechanical strength may be insufficient.

FIG. 17A shows a flowchart of a method of making a semiconductor device, and FIGS. 17B, 17C, 17D and 17E show a sequential manufacturing method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 17A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S802, of FIG. 17A, a photo resist layer is formed over the target layer, as shown in FIG. 17B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S803 of FIG. 17A, the photo resist layer is patterned using an EUV reflective mask with a pellicle as set forth above, as shown in FIG. 17C. The patterning of the photo resist layer includes performing a photolithography exposing process by an EUV exposing system using the EUV mask. During the exposing process, the integrated circuit (IC) design pattern defined on the EUV mask is imaged to the photo resist layer to form a latent pattern thereon. The patterning of the photo resist layer further includes developing the exposed photo resist layer to form a patterned photo resist layer having one or more openings. In one embodiment where the photo resist layer is a positive tone photo resist layer, the exposed portions of the photo resist layer are removed during the developing process. The patterning of the photo resist layer may further include other process steps, such as various baking steps at different stages. For example, a post-exposure-baking (PEB) process may be implemented after the photolithography exposing process and before the developing process.

At S804 of FIG. 17A, the target layer is patterned utilizing the patterned photo resist layer as an etching mask, as shown in FIG. 17D. In some embodiments, the patterning the target layer includes applying an etching process to the target layer using the patterned photo resist layer as an etch mask. The portions of the target layer exposed within the openings of the patterned photo resist layer are etched while the remaining portions are protected from etching. Further, the patterned photo resist layer may be removed by wet stripping or plasma ashing, as shown in FIG. 17E.

In some embodiments, the network membrane including carbon nanotubes subjected to the solvent dipping treatment is used for an EUV transmissive window, a debris catcher disposed between an EUV lithography apparatus and an EUV radiation source, or any other parts in an EUV lithography apparatus, where a high EUV transmittance is required.

In the foregoing embodiments, a pellicle membrane is subjected to a solvent dipping operation to remove contaminants and to form bundles of carbon nanotubes. The pellicles according to embodiments of the present disclosure provide higher strength and lower contamination as well as higher EUV transmittance than conventional pellicles.

It will be understood that not all advantages have been necessarily discussed herein, no particular advantage is required for all embodiments or examples, and other embodiments or examples may offer different advantages.

In accordance with one aspect of the present disclosure, in a method of manufacturing a pellicle for an extreme ultraviolet (EUV) photomask, a nanotube layer including a plurality of carbon nanotubes is formed, and a solvent dipping treatment to the nanotube layer is performed by applying bubbles in a solvent to the nanotube layer. In one or more of the foregoing and following embodiments, the solvent includes an organic solvent or a mixture of water and an organic solvent. In one or more of the foregoing and following embodiments, the organic solvent includes at least one selected from the group consisting of aliphatic hydrocarbons, aromatic hydrocarbons, amines, esters, ethers, ketones and alcohols. In one or more of the foregoing and following embodiments, the organic solvent includes at least one selected from the group consisting of methanol, ethanol and isopropanol. In one or more of the foregoing and following embodiments, the organic solvent includes at least one selected from the group consisting of benzene, acetones and toluene. In one or more of the foregoing and following embodiments, the solvent dipping treatment is performed for one minute to 2 hours. In one or more of the foregoing and following embodiments, the bubbles are generated by ultrasound. In one or more of the foregoing and following embodiments, the bubbles are generated by pulsed laser. In one or more of the foregoing and following embodiments, the bubbles are generated by injecting gas or a mixture of gas and liquid.

In accordance with another aspect of the present disclosure, in a method of manufacturing a pellicle for an extreme ultraviolet (EUV) photomask, a nanotube layer including a plurality of carbon nanotubes is formed, a solvent dipping treatment to the nanotube layer is performed by applying bubbles in a solvent to the nanotube layer, and the nanotube layer is dried. In one or more of the foregoing and following embodiments, the nanotube layer is inserted into the solvent with a speed of 1 mm per minute to 1000 mm per minute. In one or more of the foregoing and following embodiments, the solvent dipping treatment is performed for one minute to 2 hours. In one or more of the foregoing and following embodiments, the nanotube layer is removed from the solvent with a speed of 1 mm per minute to 1000 mm per minute. In one or more of the foregoing and following embodiments, a size of the bubbles is in a range from 1 nm to 500 nm. In one or more of the foregoing and following embodiments, a size of the bubbles is in a range from 1 μm to 10 μm. In one or more of the foregoing and following embodiments, in the drying, the nanotube layer is placed on a hot plate, and the nanotube layer is heated at a temperature in a range from 30° C. to 1000° C. In one or more of the foregoing and following embodiments, the drying is performed by heating the nanotube at a temperature in a range from 30° C. to 300° C. in an air ambient. In one or more of the foregoing and following embodiments, the drying is performed by heating the nanotube at a temperature in a range from 300° C. to 1000° C. in an inert gas ambient.

In accordance with another aspect of the present disclosure, in a method of manufacturing a pellicle for an extreme ultraviolet (EUV) photomask, a nanotube layer including a plurality of single carbon nanotubes is formed, a solvent dipping treatment to the nanotube layer is performed by applying bubbles in a solvent to the nanotube layer, and the nanotube layer is dried. An average number of carbon nanotubes in a bundle of nanotubes is 3 to 30 after the solvent dipping treatment. In one or more of the foregoing and following embodiments, a peak diameter in a size distribution of bundles of nanotubes is 10 nm to 50 nm after the solvent dipping treatment.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a pellicle for an extreme ultraviolet (EUV) photomask, comprising:
  forming a nanotube layer including a plurality of carbon nanotubes; and
  performing a solvent dipping treatment on the nanotube layer by applying bubbles in a solvent on the nanotube layer,
  wherein the bubbles are generated by pulsed laser or by injecting gas or a mixture of gas and liquid into the solvent.

2. The method of claim 1, wherein the solvent includes an organic solvent or a mixture of water and an organic solvent.

3. The method of claim 2, wherein the organic solvent includes at least one selected from the group consisting of aliphatic hydrocarbons, aromatic hydrocarbons, amines, esters, ethers, ketones and alcohols.

4. The method of claim 2, wherein the organic solvent includes at least one selected from the group consisting of methanol, ethanol and isopropanol.

5. The method of claim 2, wherein the organic solvent includes at least one selected from the group consisting of benzene, acetone and toluene.

6. The method of claim 1, wherein the solvent dipping treatment is performed for one minute to 2 hours.

7. The method of claim 1, wherein the nanotube layer is formed by chemical vapor deposition.

8. The method of claim 1, wherein an innermost carbon nanotube has a diameter of 0.5 nm to 20 nm.

9. A method of manufacturing a pellicle for an extreme ultraviolet (EUV) photomask, comprising:
  forming a nanotube layer including a plurality of carbon nanotubes;
  performing a solvent dipping treatment on the nanotube layer by applying bubbles in a solvent on the nanotube layer; and
  drying the nanotube layer by placing the nanotube layer on a hot plate and heating the nanotube layer at a temperature in a range from 300° C. to 1000° C. in an inert gas ambient.

10. The method of claim 9, wherein the nanotube layer is inserted into the solvent at a speed of 1 mm per minute to 1000 mm per minute.

11. The method of claim 10, wherein the solvent dipping treatment is performed for one minute to 2 hours.

12. The method of claim 11, wherein the nanotube layer is removed from the solvent at a speed of 1 mm per minute to 1000 mm per minute.

13. The method of claim 9, wherein a size of the bubbles is in a range from 1 nm to 500 nm.

14. The method of claim 9, wherein a size of the bubbles is in a range from 1 μm to 10 μm.

15. The method of claim 9, wherein the nanotube layer is formed by chemical vapor deposition.

16. The method of claim 9, wherein an innermost carbon nanotube has a diameter of 0.5 nm to 20 nm.

17. A method of manufacturing a pellicle for an extreme ultraviolet (EUV) photomask, comprising:
  forming a nanotube layer including a plurality of single carbon nanotubes;
  performing a solvent dipping treatment on the nanotube layer by applying bubbles in a solvent on the nanotube layer, thereby forming a plurality of bundles of the carbon nanotubes; and
  drying the nanotube layer by placing the nanotube layer on a hot plate and heating the nanotube layer at a temperature in a range from 300° C. to 1000° C. in an inert gas ambient,
  wherein an average number of carbon nanotubes in each bundle of carbon nanotubes in the plurality of bundles of carbon nanotubes is 3 to 30 after the solvent dipping treatment.

18. The method of claim 17, wherein a peak diameter in a size distribution of the plurality of bundles of carbon nanotubes is 10 nm to 50 nm after the solvent dipping treatment.

19. The method of claim 17, wherein the nanotube layer is formed by chemical vapor deposition.

20. The method of claim 17, wherein an innermost carbon nanotube has a diameter of 0.5 nm to 20 nm.

* * * * *